United States Patent
Zhang et al.

(10) Patent No.: US 10,930,508 B2
(45) Date of Patent: Feb. 23, 2021

(54) REPLACEMENT METAL GATE FORMATION OF PMOS ULTRA-LOW VOLTAGE DEVICES USING A THERMAL IMPLANT

(71) Applicant: APPLIED Materials, Inc., Santa Clara, CA (US)

(72) Inventors: Qintao Zhang, Mt. Kisco, NY (US); Kyu-Ha Shim, Andover, MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/560,224

(22) Filed: Sep. 4, 2019

(65) Prior Publication Data

US 2020/0273707 A1 Aug. 27, 2020

Related U.S. Application Data

(60) Provisional application No. 62/808,477, filed on Feb. 21, 2019.

(51) Int. Cl.
*H01L 21/265* (2006.01)
*H01L 29/66* (2006.01)
*H01L 21/8234* (2006.01)

(52) U.S. Cl.
CPC ........... *H01L 21/26586* (2013.01); *H01L 21/823431* (2013.01); *H01L 29/6681* (2013.01)

(58) Field of Classification Search
None
See application file for complete search history.

(56) References Cited

U.S. PATENT DOCUMENTS

| | | | |
|---|---|---|---|
| 7,893,502 B2 | 2/2011 | Li et al. | |
| 2013/0252349 A1* | 9/2013 | Pradhan | H01L 21/76243 438/4 |
| 2017/0133486 A1* | 5/2017 | Zhou | H01L 21/823842 |
| 2017/0170027 A1 | 6/2017 | Hou et al. | |
| 2017/0301544 A1* | 10/2017 | Chi | H01L 29/66545 |
| 2020/0051865 A1* | 2/2020 | Wang | H01L 21/823821 |

OTHER PUBLICATIONS

"Fluorine incorporation at HfO 2/SiO 2 HfO2/SiO2 interfaces in high-k metal-oxide-semiconductor gate stacks: Local electronic structure."; Authors: Jeong-Hee Ha, Kang-ill Seo, Paul C. McIntyre Krishna C. Sarawat, and Kyeongjae Cho; Applied Physics Letters 90, 112911 2007; https://doi.org/10.1063/1.2712785; 4 pages.

(Continued)

*Primary Examiner* — Asok K Sarkar
(74) *Attorney, Agent, or Firm* — Kacvinsky Daisak Bluni PLLC

(57) ABSTRACT

Disclosed are methods of forming devices. One method may include providing a first set of fins and a second set of fins extending from a substrate, and providing a dummy oxide over the first set of fins and the second set of fins. The method may further include performing a thermal implant to the second set of fins, wherein the thermal implant is an angled ion implant impacting the dummy oxide. The method may further include removing the dummy oxide from the first set of fins and the second set of fins, and forming a first work function (WF) metal over the first set of fins and a second WF metal over the second set of fins.

20 Claims, 7 Drawing Sheets

(56) References Cited

OTHER PUBLICATIONS

"The Effects of Fluorine on Parametrics and Reliability in a 0.18-um 3.5/6.8 nm Dual Gate Oxide CMOS Technology," Authors: Terence B. Hook, Eric Adler, Member, IEEE, Fernando Guarin, Member, IEEE, Joseph Lukaitis, Nivo Rovedo, and Klaus Schruefer; IEEE Transactions on Electron Devices, vol. 48, No. 7, Jul. 2001; 8 pages.

* cited by examiner

REPLACEMENT METAL GATE FORMATION OF PMOS ULTRA-LOW VOLTAGE DEVICES USING A THERMAL IMPLANT

CROSS-REFERENCE TO RELATED APPLICATION

This is a non-provisional application of pending U.S. provisional patent application Ser. No. 62/808,477, filed Feb. 21, 2019, the entirety of which application is incorporated by reference herein.

FIELD OF THE DISCLOSURE

The present embodiments relate to substrate patterning, and more particularly, to techniques for replacement metal gate formation using a thermal implant.

BACKGROUND OF THE DISCLOSURE

The electronics industry has experienced an ever-increasing demand for smaller and faster electronic devices, which are simultaneously able to support a greater number of increasingly complex and sophisticated functions. Accordingly, there is a continuing trend in the semiconductor industry to manufacture low-cost, high-performance, and low-power integrated circuits (ICs). Thus far, these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

For example, as metal gate electrodes and high-K gate dielectrics have replaced traditional polysilicon gate electrodes and silicon dioxide dielectrics, one of the key challenges has been to find metal electrode layers having appropriate work function values. To that end, a variety of metal electrode layers, and combinations thereof, having a variety of work function values (e.g., near a conduction band-edge, near a valence band-edge, or near mid-gap) have been investigated for application in a variety of device types (e.g., 2D and/or 3D N-type/P-type FETs). Generally, much attention has been devoted to various work function tuning techniques. However, in at least some existing processes, the effective work function of a given metal layer is limited by lack of an adequate tuning knob. Some traditional work function tuning approaches merely adjust a thickness of the metal layer. For example, a thicker metal layer may be at times used in an effort to overcome work function metal loading effects. Additionally, in some existing processes, poor metal layer deposition may cause gaps or voids in the metal layer, detrimentally impacting device performance.

Thus, existing techniques have not proved entirely satisfactory in all respects.

BRIEF DESCRIPTION OF THE DRAWINGS

The accompanying drawings illustrate example approaches of the disclosure, including the practical application of the principles thereof, as follows.

Figure 1A:
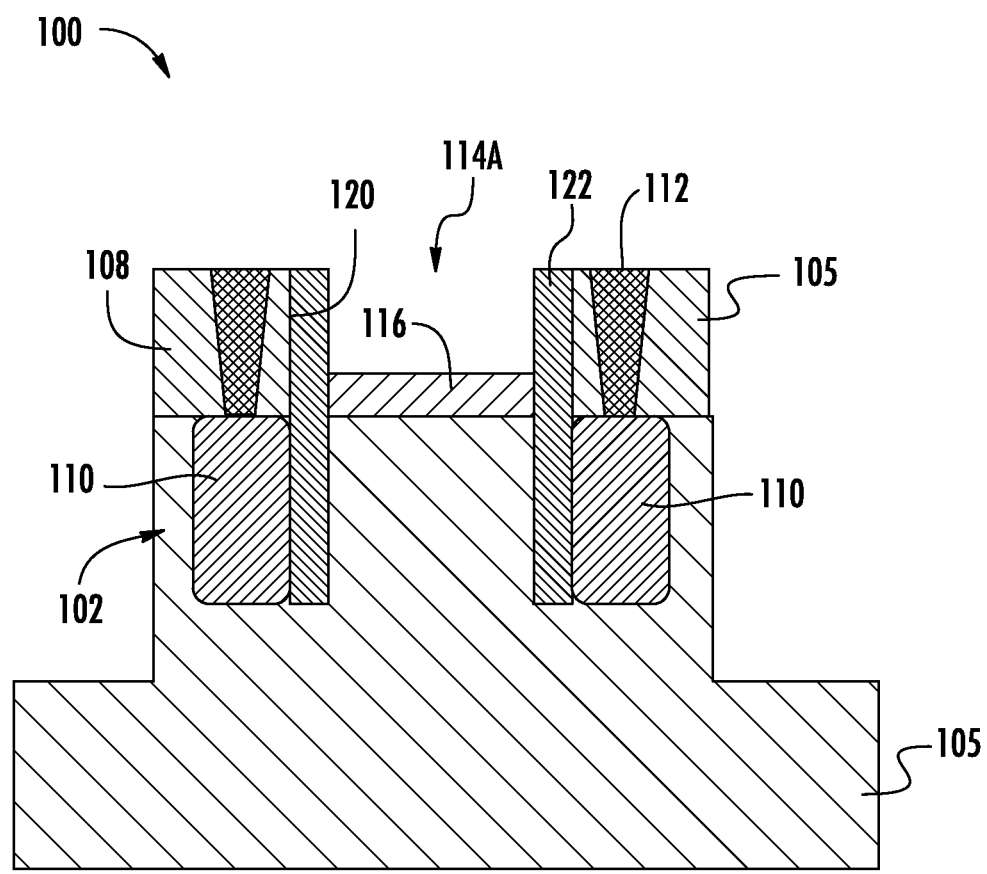
FIG. 1A depicts a first side cross-sectional view of a device during thermal implantation in accordance with embodiments of the present disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods in accordance with the present disclosure will now be described more fully hereinafter with reference to the accompanying drawings, where embodiments of the methods are shown. The methods may be embodied in many different forms and are not to be construed as being limited to the embodiments set forth herein. Instead, these embodiments are provided so this disclosure will be thorough and complete, and will fully convey the scope of the system and method to those skilled in the art.

Embodiments herein provide a novel process flow including a thermal implant to enable formation of low Vt devices, which can't be done through traditional work function (WF) thickness tuning. Although non-limiting, embodiments of the present disclosure will be described hereinafter with respect to PMOS ultra-low Vt devices. The thermal implant to a dummy oxide of the devices enables a defect-free implant, thereby improving PMOS performance. Current state-of-the-art PMOS Vt device tuning is performed by increasing TiN thickness to achieve lower Vt. However, this approach is limited by channel length shrinkage. Embodiments herein enable PMOS ultra-low Vt, thus making further gate shrinking possible.

Although non-limiting, embodiments herein will be described in the context of multi-gate devices, such as fin field-effect transistors (FinFETs). FinFETs are compatible with conventional complementary metal-oxide-semiconductor (CMOS) processes and their three-dimensional structure allows them to be aggressively scaled while maintaining gate control and mitigating SCEs. In addition, high-permittivity (high-K) dielectric materials have been introduced in an effort to reduce gate oxide leakage current while maintaining a desired gate capacitance value. However, prior high-K dielectrics have suffered from high densities of interfacial and bulk defects, which could increase carrier scattering, degrade mobility, and reduce drain current. At least some efforts to reduce defect densities have included the incorporation of fluorine, for example, which has been shown to effectively passivate interfacial dangling bonds and bulk oxygen vacancies. This in turn may reduce oxide leakage current, improve threshold voltage stability, and generally improve device performance. For the fabrication of planar devices, fluorine incorporation may be achieved by an ion implantation process. However, attempts at fluorine incorporation into FinFET devices by ion implantation may damage the FinFET fins and may be ineffective to introduce fluorine uniformly across the entire three-dimensional geometry of the FinFET fins. Existing techniques have not proved entirely satisfactory in all respects. Thus, embodiments herein overcome prior art deficiencies by providing lower fluorine implant defect counts due to an angled thermal implant to fins covered by a dummy oxide.

Figure 1B:
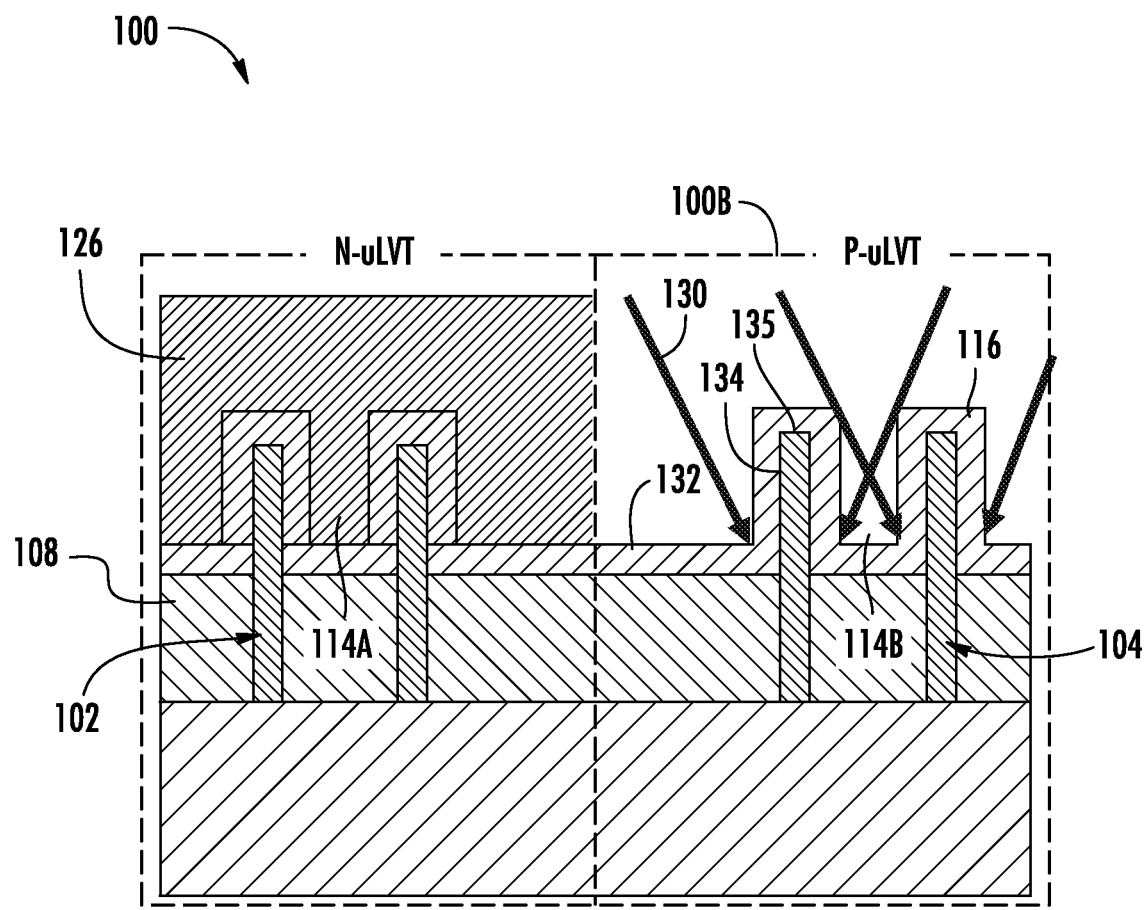
FIG. 1B depicts a second side cross-sectional view of the device of FIG. 1A during thermal implantation in accordance with embodiments of the present disclosure.

Turning now to FIGS. 1A-B, there are shown first and second cross-sectional views of a device 100 (e.g., a finFET semiconductor device) including a first set of fins 102 and a second set of fins 104. FIG. 1A depicts the device 100 cut along a fin center, while FIG. 1B depicts the device 100 cut perpendicular to the first and second sets of fins 102, 104. The device 100 includes a stack of layers including a substrate 105, a dielectric 108, and source drain regions 110, which may be formed by epitaxial (EPI) growth in some non-limiting embodiments. The device 100 may include a set of contacts 112 formed through the dielectric 108. One or more trenches 114A-114B may be formed in the substrate 105 to expose the first and second sets of fins 102, 104. Although not shown for the sake of brevity, the trenches 114A-114B may be formed by a dummy gate polysilicon removal process. A dummy oxide 116 may be formed over the device 100, including within the trenches 114A-114B. In some embodiments, the dummy oxide 116 is silicon oxide. As shown, the first set of fins 102 and the trench 114A may correspond to an n-type ultra-low Vt (N-uLVt) device 100A, and the second set of fins 104 and the trench 114B may correspond to a P-uLVt device 100B.

The terms "substrate" and/or "finned substrate" as used herein are intended to include a semiconductor substrate, a semiconductor epitaxial layer deposited or otherwise formed on a semiconductor substrate and/or any other type of semiconductor body, and all such structures are contemplated as falling within the scope of the present embodiments. For example, the semiconductor substrate may comprise a semiconductor wafer (e.g., silicon, SiGe, or an SOI wafer) or one or more die on a wafer, and any epitaxial layers or other type semiconductor layers formed there over or associated therewith. A portion or entire semiconductor substrate may be amorphous, polycrystalline, or single-crystalline. In addition to the aforementioned types of substrates, the semiconductor substrate employed in the present embodiments may also comprise a hybrid oriented (HOT) semiconductor substrate having surface regions of different crystallographic orientation. The semiconductor substrate may be doped, undoped, or contain doped regions and undoped regions therein. The semiconductor substrate may contain regions with strain and regions without strain therein, or contain regions of tensile strain and compressive strain.

In various embodiments, the first and second sets of fins 102, 104 may be fabricated using any suitable process including one or more photolithography and etch processes. The photolithography process for forming the first and second sets of fins 102, 104 may include forming a photo-resist layer (not shown) overlying the substrate 105 (e.g., on a silicon layer), exposing the resist to a pattern, performing post-exposure bake processes, and developing the resist to form a masking element including the resist. The masking element may then be used to etch the first and second sets of fins 102, 104 into the silicon layer, e.g., using reactive ion etch (RIE) and/or other suitable processes. In one embodiment, the first and second sets of fins 102, 104 are formed using a sidewall image transfer technique. In another embodiment, the first and second sets of fins 102, 104 are formed by a double-patterning lithography (DPL) process. DPL is a method of constructing a pattern on a substrate by dividing the pattern into two interleaved patterns. DPL allows enhanced feature (e.g., fin) density. Various DPL methodologies may be used including, but not limited to, double exposure (e.g., using two mask sets), forming spacers adjacent features and removing the features to provide a pattern of spacers, resist freezing, and/or other suitable processes.

Along a sidewall 120 of each of the trenches 114A-114B may be a gate spacer 122. The gate spacer 122 can be formed by depositing a blanket layer of dielectric material following by a dry etch process. A chemical mechanical planarization (CMP) process is used to planarize and expose the gate area ready for dummy gate pull and high-k metal-gate deposition. The planarized gate spacer 122 has approximately the same height as the dielectric 108. The gate spacer 122 provides electrical isolation between adjacent gate segments and with respect to the fins outside the gate.

As shown in FIG. 1B, the N-uLVt device 100A may be covered by a blocking mask 126, while a thermal implant 130 is performed on the P-uLVt device 100B. The thermal implant 130 may be a hot (e.g., 150-500° C.) implant, which improves activation, reduces damage, and reduces fin and processing variability. More specifically, the hot thermal implant may reduces growth of amorphous pockets by enhancing dynamic annealing. In general, damage is reduced as implant temperature is increased. In one example, a heated platen may be used to heat the wafer during dopant implantation.

In some embodiments, the thermal implant 130 includes a fluorine (F) ion implanted at a non-perpendicular angle relative to a top surface 132 of the dummy oxide 116 to implant F effectively to all surfaces of a FIN. For example, the angled thermal implant 130 may impart ions at approximately 25-30° incidence angle relative to the top surface 132 of the dummy oxide 116. The implantation angle may vary in other embodiments by +/−15°. The thermal implant 130 may impact the sidewalls 134 and the tops 135 of the second set of fins 104. As shown, the thermal implant 130 may directly impact the dummy oxide 116. In some embodiments, the thermal implant 130 may not be performed to the N-uLVt device 100A.

Although non-limiting, the blocking mask 126 may be a photoresist layer deposited over the device 100 and then patterned using conventional lithography. In one embodiment, the organic optical planarization (OPL) layer is a hardmask layer under a photo resist exposed to an intended pattern of radiation. Using a resist developer to develop exposed portions of the photoresist, openings are selectively formed in the photoresist layer exposing portions of the functional gate structure for subsequent removal.

Figure 2A:
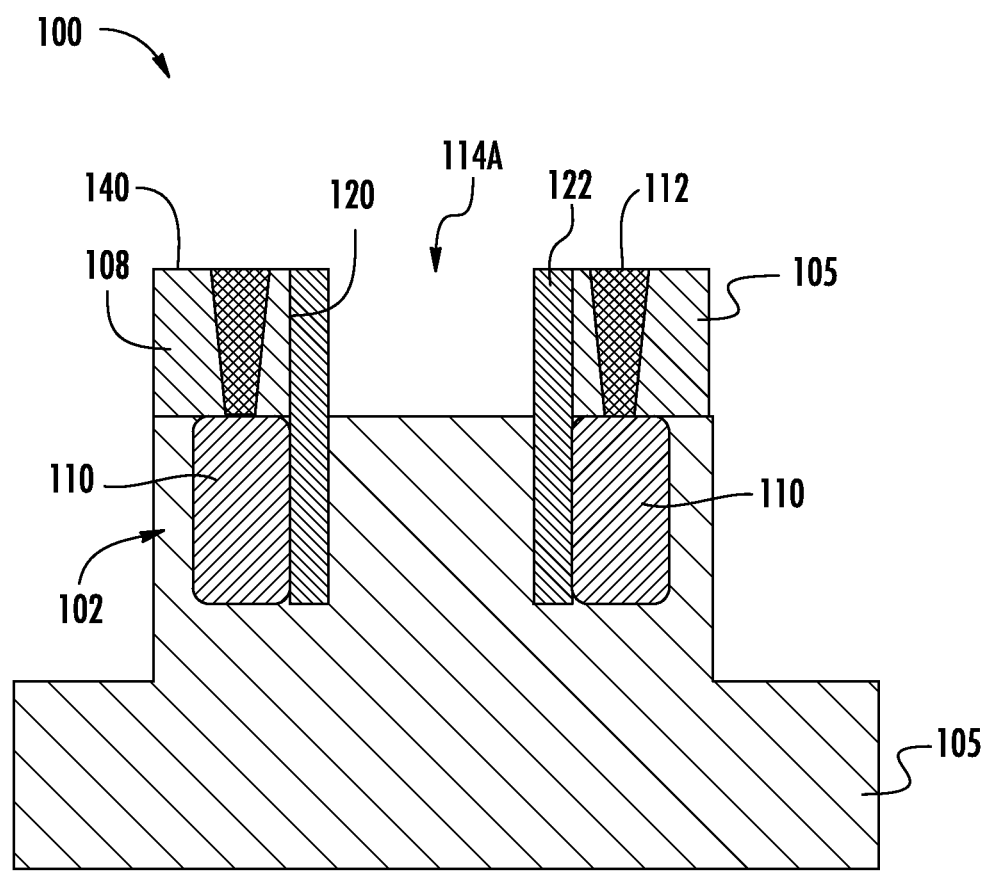
FIG. 2A depicts a side cross-sectional view of the device of FIG. 1A following removal of a dummy oxide in accordance with embodiments of the present disclosure.
Figure 2B:
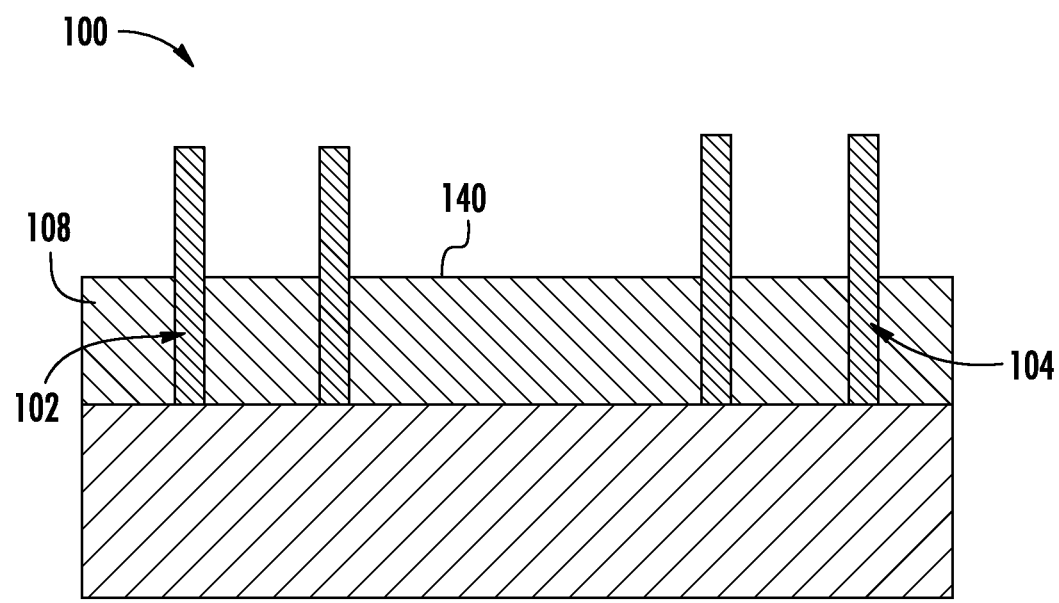
FIG. 2B depicts a side cross-sectional view of the device of FIG. 1B following removal of a dummy oxide in accordance with embodiments of the present disclosure.

Next, as shown in FIGS. 2A-2B, the dummy oxide 116 has been removed from the device 100. In some embodiments, the dummy oxide 116 is removed using one or more etches processes, such as a reactive ion etch (RIE). As shown, the etch may be selective to a top surface 140 of the dielectric 108. Furthermore, the dummy oxide 116 has been removed from the sidewalls 134 and the tops 135 of the second set of fins 104

Figure 3A:
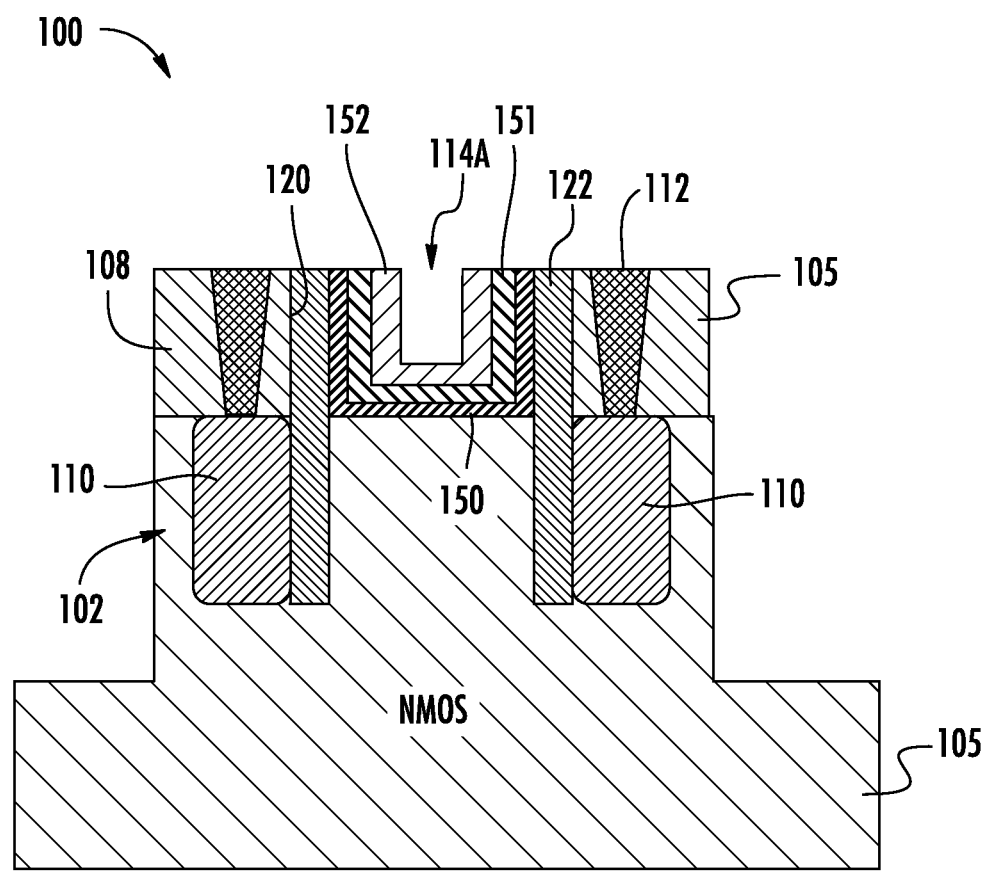
FIG. 3A depicts a side cross-sectional view of the device of FIG. 2A following deposition of metallization layers in accordance with embodiments of the present disclosure.
Figure 3B:
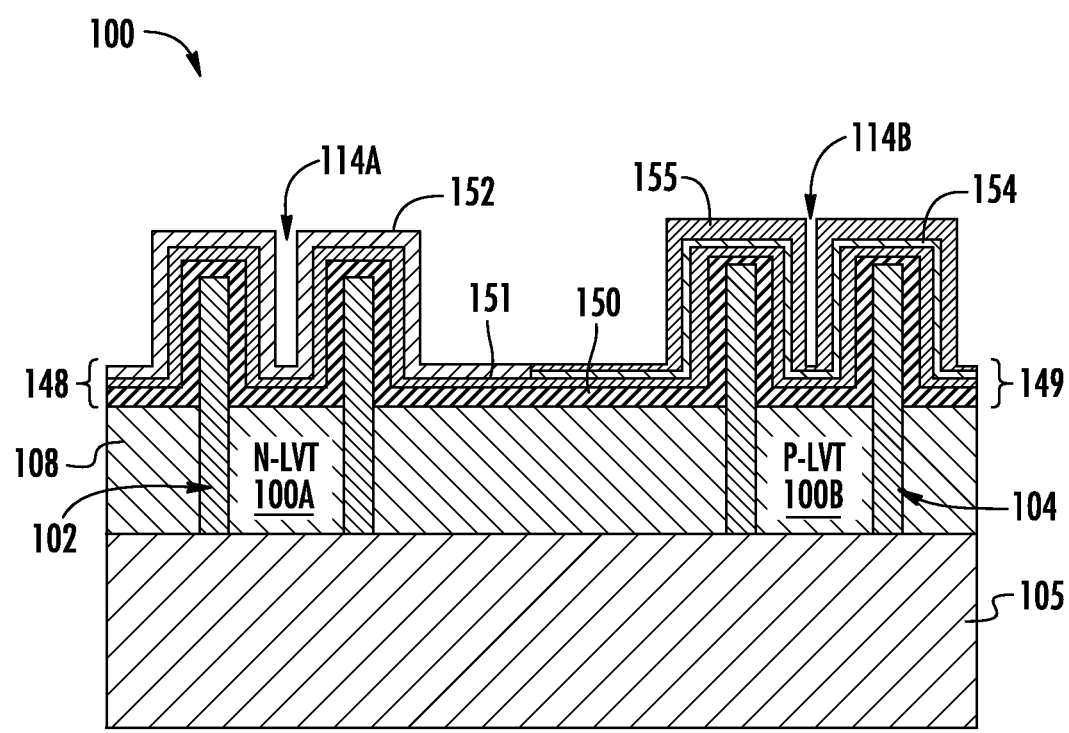
FIG. 3B depicts a side cross-sectional view of the device of FIG. 2B following deposition of metallization layers in accordance with embodiments of the present disclosure.

Turning now to FIGS. 3A-3B, formation of one or more WF metals according to embodiments of the present disclosure will be described. As shown, a first WF metal 148 may be formed over the N-uLVt device 100A, and a second WF metal 149 may be formed over the P-uLVt device 100B. In some embodiments, the first WF metal 148 is a p-type WF metal, and the second WF metal 149 is an n-type WF metal. In non-limiting embodiments, p-type WF metals may be titanium nitride (TiN), tantalum nitride (TaN), titanium carbide (TiC), tantalum carbide (TaC), tungsten carbide (WC), aluminum titanium nitride (TiAlN), and n-type WF metals may be titanium aluminide (TiAl), zirconium aluminide (ZrAl), tungsten aluminide (WAl), tantalum aluminide (TaAl), or hafnium aluminide (HfAl). To form the first and second WF metals 148, 149, an oxide layer 150 may be formed over the device 100, including over the first and second sets of fins 102, 104. The oxide layer 150 may be a high-k and $SiO_2$. The oxide layer 150 may be conformally deposited over the device 100, including within trenches 114A-114B. Next, a first metal layer 151 may be formed over the oxide layer 150, including over the first and second sets of fins 102, 104. In some embodiments, the first metal layer 151 is TiN. The first metal layer 151 may be conformally deposited over the device 100, including within trenches 114A-114B.

Next, to form the first WF metal 148, one or more masks (not shown) may be provided over the P-uLVt device 100B, and a second metal layer 152 may be formed over the first metal layer 151 of the N-uLVt device 100A, including over the first set of fins 102. In some embodiments, the second metal layer 152 is TiAl. The second metal layer 152 may be conformally deposited over the device 100, including within trench 114A.

Next, to form the second WF metal 149, the mask(s) over the P-uLVt device 100B may be removed, and one or more masks (not shown) may be provided over the N-uLVt device 100A. As shown, a barrier layer 154 may be formed over the first metal layer 151 of the P-uLVt device 100B, including over the second set of fins 104. In some embodiments, the barrier layer 154 is tantalum nitride (TaN). The barrier layer 154 may be conformally deposited over the device 100, including within trench 114B.

As further shown, a third metal layer 155 may be formed over the barrier layer 154 of the P-uLVt device 100B, including over the second set of fins 104. In some embodiments, the third metal layer 155 is TiN. The third metal layer 155 may be conformally deposited over the device 100, including within trench 114B.

Once the first and second WF metals 148, 149 are formed, processing of the device 100 may continue to form finished gate stacks. For example, following formation of the first and second WF metals 148 and 149, a conductive material or gate metal (not shown) may be deposited with the trenches 114A-114B and planarized. The gate metal may include, for example, Al, W, Cu, Pt, Ag, Au, Ru, Ir, Rh and Re, alloys of conductive metals, e.g., Al—Cu, silicides of a conductive metal, e.g., W silicide, and Pt silicide, and combinations thereof. The layer of the gate metal can be formed utilizing a conventional deposition process such as, for example, atomic layer deposition (ALD), CVD, metalorganic chemical vapor deposition (MOCVD), molecular beam epitaxy (MBE), PVD, plating, evaporation, ion beam deposition, electron beam deposition, laser assisted deposition, and chemical solution deposition.

Figure 4:
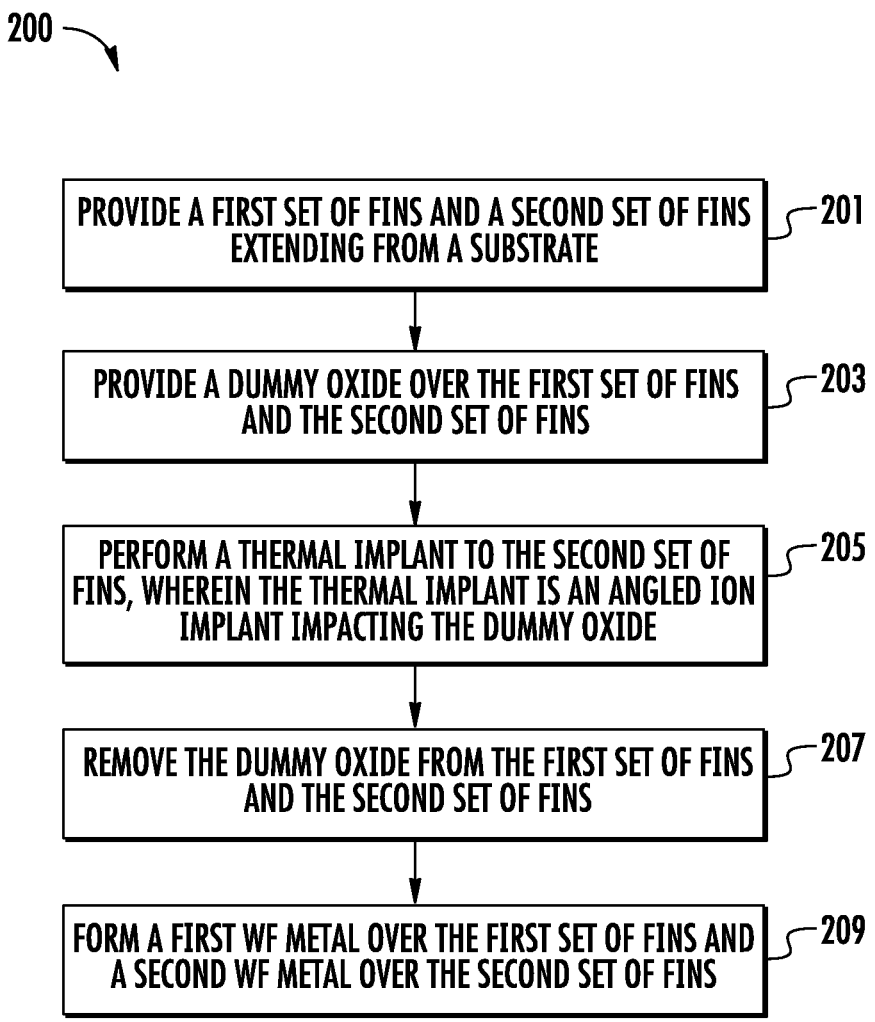
FIG. 4 depicts a process flow for forming a PMOS ultra low voltage devices using a thermal implant in accordance with embodiments of the present disclosure.

Turning now to FIG. 4, a method 200 of forming a device, such as device 100 shown in FIGS. 1A-3B, will be described. At block 201, the method 200 may include providing a first set of fins and a second set of fins extending from a substrate. In some embodiments, a dielectric is provided over the finned substrate. In some embodiments, the finned substrate is a FinFET device.

At block 203, the method 200 may further include providing a dummy oxide over the first set of fins and the second set of fins. In some embodiments, the dummy oxide is a silicon oxide conforming formed over the substrate and the dielectric, including over the first and second sets of fins.

At block 205, the method 200 may include performing a thermal implant to the second set of fins, wherein the thermal implant is an angled ion implant impacting the dummy oxide. In some embodiments, the thermal implant may be a hot (e.g., 150-500° C.) implant, which improves activation, reduces damage, and reduces fin and processing variability. In one example, a heater (e.g., a beam line heater) may be used to heat the atmosphere and/or the wafer during dopant implantation. In some embodiments, the thermal implant is a fluorine (F) ion implanted at a non-perpendicular angle relative to a top surface of the dummy oxide.

At block 207, the method 200 may further include removing the dummy oxide from the first set of fins and the second set of fins. In some embodiments, the dummy oxide is removed using a reactive ion etch selective to the dielectric and to the fins.

At block 209, the method 200 may further include forming a first WF metal over the first set of fins and a second WF metal over the second set of fins. In some embodiments, the first WF metal is a p-type WF metal, and the second WF metal is an n-type WF metal. To form the first and second WF metals an oxide layer may be formed over the device, including over the first and second sets of fins. The oxide layer may be a hi-k and $SiO_2$. The oxide layer may be conformally deposited over the device, including within the trenches. Next, a first metal layer may be formed over the oxide layer, including over the first and second sets of fins. In some embodiments, the first metal layer is TiN. The first metal layer may be conformally deposited over the device, including within trenches.

Next, to form the first WF metal, one or more masks may be provided over the P-uLVt device, and a second metal layer may be formed over the first metal layer of the N-uLVt device, including over the first set of fins. In some embodiments, the second metal layer is TiAl. The second metal layer may be conformally deposited over the device, including within the trench of the first set of fins.

Next, to form the second WF metal, the mask(s) over the P-uLVt device may be removed, and or more masks may be provided over the N-uLVt device. As shown, a barrier layer may be formed over the first metal layer of the P-uLVt device, including over the second set of fins. In some embodiments, the barrier layer is tantalum TaN. The barrier layer may be conformally deposited over the device, including within the trench of the second set of fins.

To complete the second WF metal, a third metal layer may be formed over the barrier layer of the P-uLVt device, including over the second set of fins. In some embodiments, the third metal layer is TiN. The third metal layer may be conformally deposited over the device, including within the trench of the second set of fins.

In various embodiments, design tools can be provided and configured to create the datasets used to pattern the semiconductor layers as described herein. For example, data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance running software, or implemented in hardware.

As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Although various features or elements of functionality may be individually described or claimed as separate modules, one of ordinary skill in the art will understand these features and functionality can be shared among one or more common software and hardware elements.

The term "substrate" as used herein is intended to include a semiconductor substrate, a semiconductor epitaxial layer deposited or otherwise formed on a semiconductor substrate and/or any other type of semiconductor body, and all such structures are contemplated as falling within the scope of the present embodiments. For example, the semiconductor substrate may comprise a semiconductor wafer (e.g., silicon, SiGe, or an SOI wafer) or one or more die on a wafer, and any epitaxial layers or other type semiconductor layers formed there over or associated therewith. A portion or entire semiconductor substrate may be amorphous, polycrystalline, or single-crystalline. In addition to the aforementioned types of substrates, the semiconductor substrate employed in the present embodiments may also comprise a hybrid oriented (HOT) semiconductor substrate having surface regions of different crystallographic orientation. The semiconductor substrate may be doped, undoped, or contain doped regions and undoped regions therein. The semiconductor substrate may contain regions with strain and regions without strain therein, or contain regions of tensile strain and compressive strain.

As used herein, the term "depositing" may include any now known or later developed techniques appropriate for the material to be deposited. For example, depositing may include: chemical vapor deposition (CVD), low-pressure CVD (LPCVD), plasma-enhanced CVD (PECVD), semi-atmosphere CVD (SACVD) and high density plasma CVD (HDPCVD). Depositing may further include: rapid thermal CVD (RTCVD), ultra-high vacuum CVD (UHVCVD), limited reaction processing CVD (LRPCVD), metal-organic CVD (MOCVD), sputtering deposition, and ion beam deposition. Depositing may further include: electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation.

For the sake of convenience and clarity, terms such as "top," "bottom," "upper," "lower," "vertical," "horizontal," "lateral," and "longitudinal" are used herein to describe the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporating the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

In view of the foregoing, at least the following advantages are achieved by the embodiments disclosed herein. Firstly, low fluorine implant defect counts are possible due to the use of the thermal implant to the dummy oxide. Secondly, the implant profile is better controlled due to the presence of the dummy oxide during the thermal implant. Thirdly, a higher threshold voltage tunability is possible because fluorine of the thermal implant is closer to the SiO2/Si interface of the fins and oxide layer. Fourthly, a high-quality TiN layer may be produced by avoiding TiN implant damage, thus resulting in a better fluorine barrier layer, and preventing fluorine out diffusing from gate. Furthermore, this provides a more reliable fluorine Vt tuning.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

The invention claimed is:
1. A method of forming a device, comprising:
   providing a first set of fins and a second set of fins extending from a substrate;
   providing a dummy oxide over the first set of fins and the second set of fins;

performing a thermal implant to the second set of fins, wherein the thermal implant is an angled ion implant impacting the dummy oxide;

removing the dummy oxide selective to the first set of fins and the second set of fins; and forming a first work function (WF) metal over the first set of fins and a second WF metal over the second set of fins after the dummy oxide is removed, wherein forming the first and second WF metals comprises conformally depositing an oxide layer over the first set of fins and the second set of fins, and wherein the oxide layer is in direct contact with the first set of fins and the second set of fins.

2. The method of claim 1, wherein the thermal implant is a fluorine ion implant.

3. The method of claim 1, further comprising:
forming a blocking mask over the first set of fins; and
performing the thermal implant to the second set of fins while the blocking mask is present over the first set of fins.

4. The method of claim 1, further comprising performing a reactive ion etch to remove the dummy oxide.

5. The method of claim 1, wherein forming the first WF metal comprises:
forming a first metal layer over the oxide layer; and
forming a second metal layer over the first metal layer.

6. The method of claim 5, wherein the oxide layer is silicon oxide.

7. The method of claim 5, wherein the first metal layer is titanium nitride.

8. The method of claim 5, wherein the second metal layer is titanium aluminide.

9. The method of claim 5, wherein forming the second WF metal comprises:
forming the first metal layer over the oxide layer;
forming a barrier layer over the first metal layer; and
forming a third metal layer over the barrier layer.

10. The method of claim 9, wherein the barrier layer is tantalum nitride.

11. The method of claim 9, wherein the third metal layer is titanium nitride.

12. A method of forming an ultra-low voltage device, comprising:
providing a dielectric over a substrate, the substrate including a first set of fins and a second set of fins;
providing a dummy oxide over the substrate and the dielectric;
performing a thermal implant to the second set of fins, wherein the thermal implant is an angled ion implant received at the dummy oxide;
removing the dummy oxide from the substrate and the dielectric following the thermal implant, wherein the dummy oxide is removed selective to the first set of fins and the second set of fins; and forming a first work function (WF) metal over the first set of fins and a second WF metal over the second set of fins, wherein forming the first and second WF metals comprises conformally depositing an oxide layer over the first set of fins and the second set of fins, and wherein the oxide layer is in direct contact with the first set of fins and the second set of fins.

13. The method of claim 12, wherein the thermal implant is a fluorine ion implant.

14. The method of claim 12, further comprising:
forming a blocking mask over the first set of fins; and
performing the thermal implant to the second set of fins while the blocking mask is present over the first set of fins.

15. The method of claim 12, further comprising performing a reactive ion etch to remove the dummy oxide.

16. The method of claim 12, wherein forming the first WF metal comprises:
forming a first metal layer over the oxide layer; and
forming a second metal layer over the first metal layer.

17. The method of claim 16, wherein the oxide layer is silicon oxide, wherein the first metal layer is titanium nitride, and wherein the second metal layer is titanium aluminide.

18. The method of claim 16, wherein forming the second WF metal comprises:
forming the first metal layer over the oxide layer;
forming a barrier layer over the first metal layer; and
forming a third metal layer over the barrier layer.

19. The method of claim 18, wherein the barrier layer is tantalum nitride, and wherein the third metal layer is titanium nitride.

20. A method of forming a PMOS ultra-low voltage device, comprising:
providing a substrate including a first set of fins and a second set of fins;
providing a dielectric atop the substrate;
providing a dummy oxide over the first set of fins and the second set of fins;
performing a thermal implant to the second set of fins, wherein the thermal implant is an angled ion implant received at the dummy oxide;
removing the dummy oxide selective to the first set of fins and the second set of fins following the thermal implant; and
forming a first work function (WF) metal over the first set of fins and a second WF metal over the second set of fins after the dummy oxide is removed, wherein forming the first and second WF metals comprises conformally depositing an oxide layer over the first set of fins and the second set of fins, and wherein the oxide layer is in direct contact with the first set of fins and the second set of fins.

* * * * *